United States Patent
Subbiah Swamy

(10) Patent No.: US 9,715,912 B2
(45) Date of Patent: Jul. 25, 2017

(54) SOURCE SYNCHRONOUS CLOCK GENERATION CIRCUITS AND METHODS FOR A SYSTEM ON A CHIP (SOC) DATA PROCESSING SYSTEM

(71) Applicant: ARM LIMITED, Cambridge (GB)

(72) Inventor: Ramnath Bommu Subbiah Swamy, Sheffield (GB)

(73) Assignee: ARM Limited, Cambridge (GB)

( * ) Notice: Subject to any disclaimer, the term of this patent is extended or adjusted under 35 U.S.C. 154(b) by 146 days.

(21) Appl. No.: 14/696,685

(22) Filed: Apr. 27, 2015

(65) Prior Publication Data
US 2016/0314829 A1 Oct. 27, 2016

(51) Int. Cl.
*G11C 7/22* (2006.01)
*G06F 13/16* (2006.01)
*G11C 7/10* (2006.01)

(52) U.S. Cl.
CPC .............. *G11C 7/222* (2013.01); *G06F 13/16* (2013.01); *G11C 7/1051* (2013.01)

(58) Field of Classification Search
CPC ............ G11C 11/4076; G11C 11/4096; G11C 11/408; G11C 7/1051; G11C 7/222; G06F 13/16; H03L 7/193
See application file for complete search history.

(56) References Cited

U.S. PATENT DOCUMENTS

| | | | |
|---|---|---|---|
| 2007/0033337 A1* | 2/2007 | Butt | G11C 7/1051 711/105 |
| 2011/0302356 A1* | 12/2011 | Helton | G11C 7/222 711/103 |
| 2013/0083611 A1* | 4/2013 | Ware | G06F 1/3275 365/191 |
| 2014/0281325 A1* | 9/2014 | Meaney | G06F 13/1689 711/167 |

* cited by examiner

*Primary Examiner* — Harry W Byrne
*Assistant Examiner* — Ajay Ojha
(74) *Attorney, Agent, or Firm* — Nixon & Vanderhye P.C.

(57) ABSTRACT

An integrated circuit device comprises a first data processing element having a first data interface configured to synchronously communicate data according to a first clock signal at a first clock speed, and a second data interface configured to synchronously communicate data at a second clock speed lower than the first clock speed; and a second data processing element configured to operate in response to a second clock signal at the second clock speed and to synchronously communicate data with the first data processing element via the second data interface according to the second clock speed; the first data processing element being configured to derive, from a source clock signal, the first clock signal and the second clock signal; and the first data processing element and the second data processing element each comprising a clock signal interface by which the second clock signal is provided by the first data processing element to the second data processing element.

17 Claims, 8 Drawing Sheets

SOURCE SYNCHRONOUS CLOCK GENERATION CIRCUITS AND METHODS FOR A SYSTEM ON A CHIP (SOC) DATA PROCESSING SYSTEM

BACKGROUND

This disclosure relates to integrated circuits and to data processing within such integrated circuits.

Some integrated circuit devices, for example so-called "systems on chip" (SoC) devices, provide data processing functions on a single integrated circuit substrate along with a first data processing element acting as an interface, sometimes referred to as a physical interface or PHY, to one or more external memory devices. A second data processing element, for example a memory controller (MC), is provided on the substrate to communicate with the PHY.

In some examples, at least some functions of the PHY operate at a higher clock speed than the clock speed by which the MC operates. An example arrangement relates to the use of so-called double data rate (DDR) memory such as DDR synchronous dynamic random access memory (DDR SDRAM). Here, the expression "DDR" is used in a generic manner to refer to variants of the DDR arrangement, including (without limitation) the so-called DDR2, DDR3 and other variants.

DDR memory communicates data at twice the rate of an equivalent single data rate (SDR) memory device running at the same clock speed.

In terms of the PHY, the use of DDR memory involves the PHY communicating data, address and/or control signals with the MC at a particular clock speed and a data width (number of bits handled in parallel) of N, but communicating such signals with the DDR memory at twice that clock speed but a data width of N/2.

Accordingly, at least parts of the PHY require a clock signal at twice the clock frequency of the clock signal required by at least parts of the MC.

SUMMARY

In an example arrangement there is provided an integrated circuit device comprising:

a first data processing element having a first data interface configured to synchronously communicate data according to a first clock signal at a first clock speed, and a second data interface configured to synchronously communicate data at a second clock speed lower than the first clock speed; and a second data processing element configured to operate in response to a second clock signal at the second clock speed and to synchronously communicate data with the first data processing element via the second data interface according to the second clock speed;

the first data processing element being configured to derive, from a source clock signal, the first clock signal and the second clock signal; and the first data processing element and the second data processing element each comprising a clock signal interface by which the second clock signal is provided by the first data processing element to the second data processing element.

In another example arrangement there is provided a data processing element forming part of an integrated circuit device, the data processing element comprising:

a first data interface configured to synchronously communicate data according to a first clock signal at a first clock speed and a second data interface configured to synchronously communicate data with a second data processing element at a second clock speed lower than the first clock speed;

the data processing element being configured to derive, from a source clock signal, the first clock signal and a second clock signal at the second clock speed; and a clock signal interface by which the second clock signal can be provided by the data processing element to the second data processing element.

In another example arrangement there is provided an integrated circuit device comprising:

first data processing means for synchronously communicating data via a first data interface, according to a first clock signal at a first clock speed, and for synchronously communicating data via a second data interface at a second clock speed lower than the first clock speed; and second data processing means, responsive to a second clock signal at the second clock speed, for synchronously communicating data with the first data processing element via the second data interface at the second clock speed;

the first data processing means comprising means for deriving, from a source clock signal, the first clock signal and the second clock signal; and the first data processing means and the second data processing means each comprising a clock signal interface means by which the second clock signal is provided by the first data processing element to the second data processing element.

In another example arrangement there is provided a data processing element forming part of an integrated circuit device, the data processing element comprising:

a first data interface means for synchronously communicating data according to a first clock signal at a first clock speed, and a second data interface means for synchronously communicating data with a second data processing element at a second clock speed lower than the first clock speed;

the data processing element comprising means for deriving, from a source clock signal, the first clock signal and a second clock signal at the second clock speed; and the data processing element comprising means for providing the second clock signal to the second data processing element.

In another example arrangement there is provided a method of operation of an integrated circuit device, the method comprising:

a first data processing element synchronously communicating data via a first interface according to a first clock signal at a first clock speed, and synchronously communicating data via a second data interface at a second clock speed lower than the first clock speed;

a second data processing element, in response to a second clock signal at the second clock speed, synchronously communicating data with the first data processing element via the second data interface at the second clock speed;

the first data processing element deriving, from a source clock signal, the first clock signal and the second clock signal; and the first data processing element providing the second clock signal to the second data processing element.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EXAMPLE EMBODIMENTS

Figure 1:
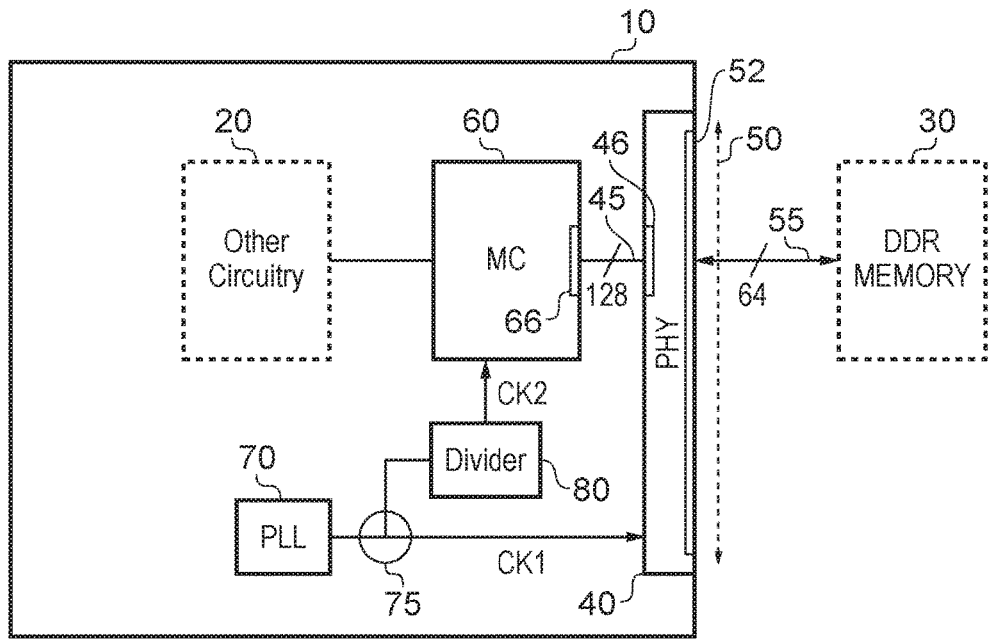
FIG. 1 schematically illustrates a part of an integrated circuit device.

Before discussing the embodiments with reference to the accompanying figures, the following description of embodiments is provided.

An example embodiment provides an integrated circuit device comprising:

a first data processing element having a first data interface configured to synchronously communicate data according to a first clock signal at a first clock speed, and a second data interface configured to synchronously communicate data at a second clock speed lower than the first clock speed; and a second data processing element configured to operate in response to a second clock signal at the second clock speed and to synchronously communicate data with the first data processing element via the second data interface according to the second clock speed;

the first data processing element being configured to derive, from a source clock signal, the first clock signal and the second clock signal; and the first data processing element and the second data processing element each comprising a clock signal interface by which the second clock signal is provided by the first data processing element to the second data processing element.

Example embodiments of the present disclosure address an issue which can arise in integrated circuits of the type described above. In particular, where a first data processing element (such as, for example, a PHY device) operates, at least in part, at a higher clock speed than a second data processing element (such as, for example an MC device), if the higher and lower speed clock signals are derived by circuitry (such as, for example, a divider) external to the first data processing element (even if on the same integrated circuit substrate) there can be a potential divergence in clock timing between the two clock signals because of the different paths taken by the two clock signals. This potential divergence can affect timing-critical operations or data paths. Example embodiments address this by providing the clock generation, in particular the generation of the lower speed (second) clock signal, as part of the functionality of the first data processing element. The first data processing element provides the second clock signal to the second data processing element. This can reduce the potentially divergent paths of the two clock signals and therefore reduce the potential for timing divergence between them.

Various types of first and second data processing element may be used, but in example embodiments the first data processing element is a physical interface element, the first data interface being a physical interface with one or more external devices, external to the integrated circuit device. In example embodiments the second data processing element is a memory controller configured to communicate data with the physical interface element. For example, the one or more external devices may comprise one or more memory devices such as double data rate (DDR) memory devices.

At a general level, the first clock signal is simply faster than the second clock signal. Various techniques for generating first and second clock signals may be used, such as inter-related phase-locked loops. But in elegantly convenient example embodiments, the second clock speed is a factor of n lower than the first clock speed, where n is greater than 1. This in turn allows the convenient use of a clock divider, as part of the first data processing element, configured to divide the first clock signal by a factor of n to generate the second clock signal. The factor n may be any number greater than 1, for example an integer greater than 1. In example embodiments the factor n is equal to 2 raised to an integer power. For example, n could equal 2.

For convenient flexibility of operation, and to allow (for temporary, debug or other design considerations) a second data processing element to use a separate second clock source, power consumption and heat generation by the first data processing element can be reduced by the first data processing element comprising control logic configured to selectively disable operation of the clock divider.

Although the first data processing element could be configured to generate or otherwise derive both the first clock signal and the second clock signal from a source clock signal (the source clock signal being neither the first nor the second clock signal), in example embodiments the source clock signal is at the same clock speed as the first clock signal. This allows the convenient and elegantly simple re-use of the source clock signal (or a clock signal which is frequency-locked to the source clock signal) as the first clock signal, avoiding the need for separate circuitry to explicitly generate the first clock signal from the source clock signal. In such instances, the "deriving" of the first clock signal from the source clock signal can be as straightforward as simply using the source clock signal as the first clock signal.

In some example embodiments, the integrated circuit device comprises two or more first data processing elements each generating a respective second clock signal. Various further techniques are used in example embodiments to provide for appropriate clock signals being used by the second data processing element in such situations.

In some example embodiments, the second data processing element comprises:

two or more interfaces for data communication with respective first data processing elements; and two or more clock signal interfaces each configured to receive a second clock signal from a respective first data processing element, for use in data communication with that respective first data processing element.

In some example embodiments, the second data processing element comprises control circuitry configured to control data communication with multiple ones of the first data processing elements. In such cases, for example, the control circuitry can be configured to operate under the control of one of the second clock signals, or in other examples, the control circuitry can comprise multiple control circuitry sections, each associated with communication with a respective first data processing element, the multiple control circuitry sections being configured to communicate with one another asynchronously with respect to the second clock signals.

The present techniques may be implemented by embodiments including just the first data processing element, for example in the form of a module of an integrated circuit. Features of example embodiments relating to an integrated circuit device are also applicable to example embodiments relating to a data processing element. Accordingly another example embodiment provides a data processing element forming part of an integrated circuit device, the data processing element comprising:

a first data interface configured to synchronously communicate data according to a first clock signal at a first clock speed and a second data interface configured to synchronously communicate data with a second data processing element at a second clock speed lower than the first clock speed;

the data processing element being configured to derive, from a source clock signal, the first clock signal and a second clock signal at the second clock speed; and a clock signal interface by which the second clock signal can be provided by the data processing element to the second data processing element.

Another example embodiment provides an integrated circuit device comprising:

first data processing means for synchronously communicating data via a first data interface, according to a first clock signal at a first clock speed, and for synchronously communicating data via a second data interface at a second clock speed lower than the first clock speed; and second data processing means, responsive to a second clock signal at the second clock speed, for synchronously communicating data with the first data processing element via the second data interface at the second clock speed;

the first data processing means comprising means for deriving, from a source clock signal, the first clock signal and the second clock signal; and the first data processing means and the second data processing means each comprising a clock signal interface means by which the second clock signal is provided by the first data processing element to the second data processing element.

Another example embodiment provides a data processing element forming part of an integrated circuit device, the data processing element comprising:

a first data interface means for synchronously communicating data according to a first clock signal at a first clock speed, and a second data interface means for synchronously communicating data with a second data processing element at a second clock speed lower than the first clock speed;

the data processing element comprising means for deriving, from a source clock signal, the first clock signal and a second clock signal at the second clock speed; and the data processing element comprising means for providing the second clock signal to the second data processing element.

Another example embodiment provides a method of operation of an integrated circuit device, the method comprising:

a first data processing element synchronously communicating data via a first interface according to a first clock signal at a first clock speed, and synchronously communicating data via a second data interface at a second clock speed lower than the first clock speed;

a second data processing element, in response to a second clock signal at the second clock speed, synchronously communicating data with the first data processing element via the second data interface at the second clock speed;

the first data processing element deriving, from a source clock signal, the first clock signal and the second clock signal; and the first data processing element providing the second clock signal to the second data processing element.

FIG. 1 schematically illustrates a part of an integrated circuit device 10 such as a so-called system on chip (SoC) device. The SoC device is fabricated as a single integrated circuit device.

An SoC device can carry out a variety of data processing functions, and so in FIG. 1 this range of possibilities is represented by the presence of "other circuitry" 20 which is a generic expression of the various possibilities of data processing circuitry which may be present on the SoC device. Accordingly, the exact nature of the "other circuitry" 20 is immaterial to the present disclosure except for one aspect which is that the other circuitry 20 requires communication with one or more external devices, such as a double data rate (DDR) memory 30.

To provide communication with an external device of this nature, the integrated circuit device 10 provides a physical interface (PHY) 40. The PHY 40 provides external pin connections via a first interface 52 along a length 50 of one or more external sides of the integrated circuit device 10. Here, the term "pin" signifies an electrical conductor to which a physical connection such as a soldered or clipped connection may be made; it does not necessarily require a protruding or rigid conductor to be provided, but rather any type of electrical conductors such as a pad maybe used.

Accordingly, the PHY 40 provides the appropriate impedance matching and other parameters by the first interface 52 for connecting data or other signals internal to the integrated circuit device 10 (such as signals 45 into appropriate corresponding signals 55) to the external device 30.

A second data processing element is arranged to communicate the signals 45 with the PHY 40. In the example of FIG. 1, the second data processing element is a memory controller (MC) 60, but in other examples the second data processing element could be part of the "other circuitry" 20. The MC 60 has an interface 66 for communicating the signals 45, which cooperates with an interface 46 at the PHY.

An aspect of the arrangement shown in FIG. 1 is that data communication between the PHY 40 and the DDR memory 30 operates at a higher clock speed than data communication between the MC 60 and the PHY 40. Correspondingly, the signals 45 between the MC 60 and the PHY 40 have a greater data width (bit width, or number of bits communicated in parallel) than the signals 55 between the PHY 40 and the DDR memory 30. In the example shown in FIG. 1, the signals 45 have a data width of 128 bits and the signals 55 have a data width of 64 bits, but communication between the PHY 40 and the DDR memory 30 operates at twice the rate of communication between the MC 60 and the PHY 40. It will of course be recognised that other multiples may be used. For example, the communication between the PHY 40 and the DDR memory 30 could in fact operate at 4 times the clock rate of communication between the MC 60 and the PHY 40. For convenience, the ratio between the two clock rates is set at an integer power of 2 (such as 2, 4, 8 . . . ) because (as discussed below) this makes the generation of the different clock signals more straightforward. However, other ratios (not being integer powers of 2) could be used. Also, although the same factor is employed in FIG. 1 between the two clock speeds and (as its inverse) the two data widths (so that, in this example, the signal 55 has half the data width and twice the clock speed of the signal 45) other relationships could be used, for example the signal 55 having 4 times the clock speed and half the data width of the signal 45. However, in order to avoid wasted data transmission capacity, example embodiments employ the same factor (and its inverse) as discussed above.

Note that the signals 45 could be data, address, control or other information. The signals 45 could represent a succession of such information, for example a memory address followed by a data value to be written to that address.

FIG. 1 also schematically illustrates the generation of respective clock signals to control at least some operations of the PHY 40 and at least some operations of the MC 60. A clock signal source such as a phase-locked loop (PLL) 70 generates a first clock signal CK1 to control aspects of the operation of the PHY 40. The clock signal CK1 is passed to a divider 80 (in this example, a divide-by-two divider) which generates a second clock signal CK2 at half the clock speed of the clock signal CK1, to control operations of the MC 60.

An issue which can arise in such an arrangement is that the clock signals CK1 and CK2 should have a close and predictable phase relationship to one another in order for the data communication between the MC, the PHY and the DDR memory to operate in a predictable manner. However, in the arrangement shown in FIG. 1, a point 75 at which the two clock signals CK1 and CK2 diverge in terms of their electrical paths through the integrated circuit device 10 is (a) relatively distance from the MC 60 and the PHY 40, and (b) not necessarily at a predictable position with respect to either the MC 60 or the PHY 40.

With regard to the point (b) the layout of an integrated circuit 10 such as an SoC of this nature is often performed using layout tools such as computer software-based layout tools which provide for functionality such as the PHY 40 and the divider 80 to be inserted as modules (sometimes referred to as "hard macros"), with the system designer specifying the signal or logical interconnections between these modules but the layout tool allocating physical space on the integrated circuit substrate at which the physical circuitry corresponding to the modules is actually laid out for fabrication. Indeed, in at least some systems, the physical positioning on the integrated circuit substrate of the circuitry corresponding to the modules may be wholly or at least partially out of the control of the system designer. This aspect contributes to the issue that the point 75 at which the two clock signals electrically diverge can be at a physical position on the integrated circuit substrate which is not necessarily predictable by the system designer. This can lead to variations in operational aspects of the fabricated integrated circuit device 10 arising from variations in the relationship between the clock signals CK1 and CK2.

Figure 2A:
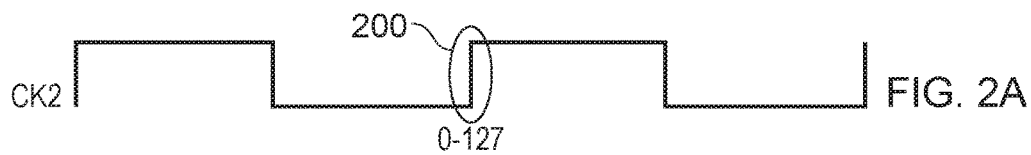
FIGS. 2A and 2B schematically illustrate clocking signals.
Figure 2B:
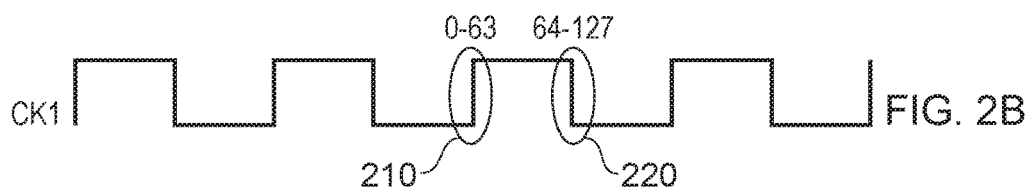

FIGS. 2a and 2b schematically illustrate the clock signals CK2 and CK1 respectively. As discussed, in the present example the clock signal CK1 has twice the clock speed of the clock signal CK2, but other ratios may be used. The data handling at an example 1 of the clock edges of the clock signal CK2 is described; it will be appreciated that corresponding data handling can be performed at other ones of the clock edges.

Referring to FIG. 2a, at a clock edge 200 of the clock signal CK2, communication of the signal 45 is provided between the MC 60 and the PHY 40. The present example relates to communication from the MC 60 to the PHY 40, but it will be appreciated that a corresponding example in the other direction could be employed. Therefore, at the clock edge 200, all 128 bits (bits 0 . . . 127) of the signal 45 are made available to the input of the PHY 40.

Referring to FIG. 2b, at a clock edge 210 of the clock signal CK1, half of the bits of the signal 45 (for example bits 0 . . . 63) are handled by the PHY 40 for transmission to the DDR memory 30. Then, at a next clock edge 220 of the clock signal CK1, the remaining bits (in this example, bits 64 . . . 127) of the signal 45 are handled by the PHY 40 for transmission as a next data word to the DDR memory 30.

Figure 3:
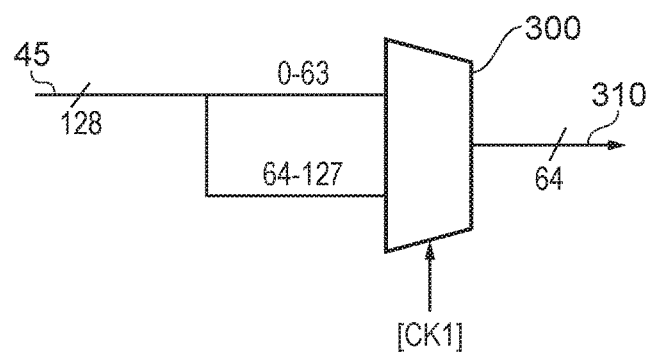
FIG. 3 schematically illustrates a part of the operation of a ratio bridge.

Circuitry is provided within the PHY 40 to handle the input of data words at a higher clock rate but a lower data width than the manner in which the data words are provided from the MC 60. Such circuitry may be referred to as a ratio bridge. FIG. 3 schematically illustrates a part of the operation of a ratio bridge.

In FIG. 3, the 128 bit signal 45 is provided, as two portions, to a multiplexer arrangement 300 (shown schematically as a single multiplexer but which could be implemented as a bank of multiplexers) operating under the control of a signal derived from the clock signal CK1. Depending on the state of the control signal derived from the clock signal CK1, the multiplexer arrangement 300 passes either a first subset of bits of the input signal 45 (such as bits 0 . . . 63) or a second subset such as bits 64 . . . 127 as an output signal 310 for further handling by the PHY 40 and transmission to the DDR memory 30.

Figure 4:
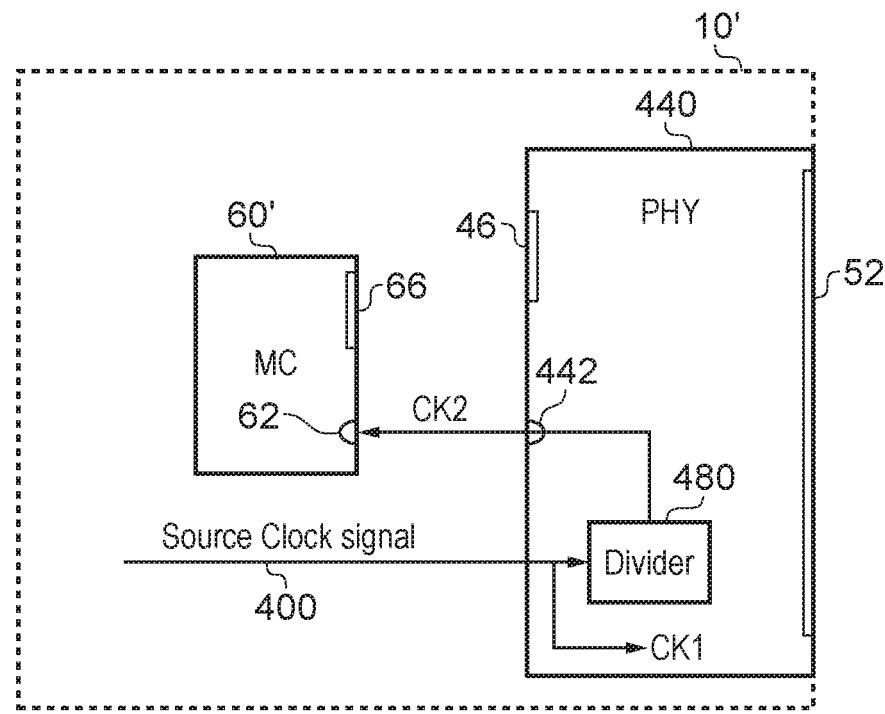
FIGS. 4 and 5 schematically illustrate the generation of a second clock signal by a PHY.
Figure 5:
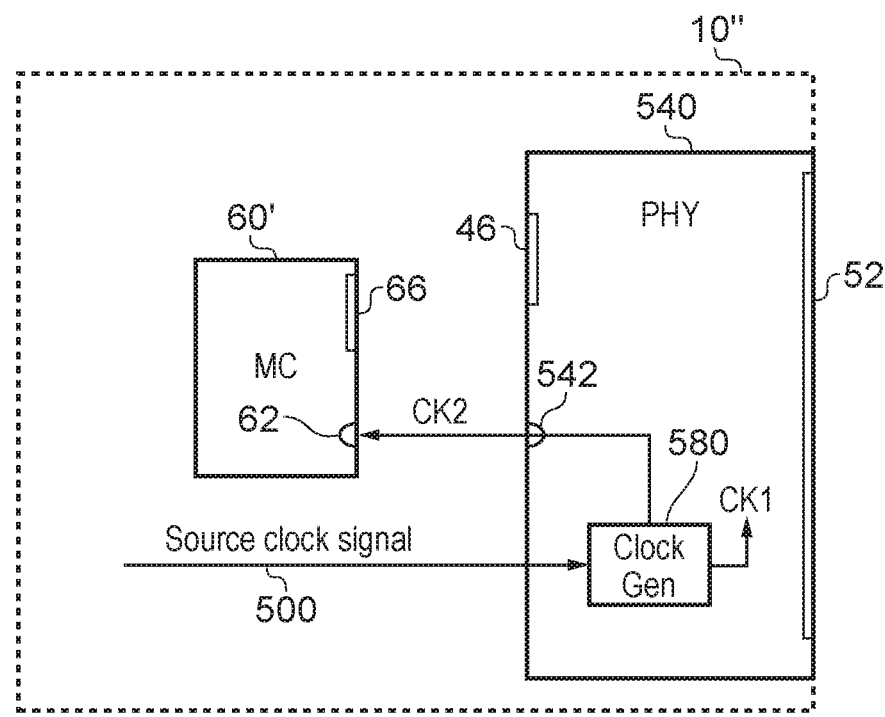

FIGS. 4 and 5 schematically illustrate integrated circuit devices 10', 10" respectively, and schematically illustrate the generation of the second clock signal CK2 by the PHY (referred to by the reference numerals 440 (FIG. 4) and 540 (FIG. 5)). Aspects of the circuitry relating to clock signal generation are shown in FIGS. 4 and 5; other aspects of the circuitry (some of which are illustrated by FIG. 1) are omitted for clarity of the diagrams.

In both of FIGS. 4 and 5, a source clock signal 400, 500 is supplied to the PHY 440, 540, and from that source clock signal 400, 500 the PHY 440, 540 derives the clock signal CK2 for provision to the MC 60'. The source clock signal 400, 500 can be provided by an on-chip clock signal source such as the PLL 70 of FIG. 1, or by external circuitry.

In the example of FIG. 4, the source clock signal 400 is suitable for use as the clock signal CK1 to control at least some operations of the PHY 440. Accordingly, the PHY 440 comprises a divider 480 configured to divide the source clock signal 400 by the appropriate ratio (in this example, to divide it by 2) to generate the clock signal CK2. The clock signal CK2 is provided to the MC 60' by a connection between an interface 442 on the PHY 440 and an interface 62 on the MC 60'.

In the example of FIG. 5, both the clock signals CK1 and CK2 are derived from the source clock signal 500. This is to illustrate the alternative possibility that the source clock signal 500 is not in fact the same as either of the clock signals CK1 or CK2 (the arrangement of FIG. 4 being an example of one in which the source clock signal 400 is at the same clock speed as the first clock signal CK1). A clock generator 580 generates or derives the clock signals CK1 and CK2 from the source clock signal 500. For example, the source clock signal 500 could have twice the clock speed of the clock signal CK1, which in turn (in this example) has twice the clock speed of the clock signal CK2. So, in such an example, the clock generator provided in the PHY 540 is configured to generate the clock signal CK1 by a division by two of the source clock signal 500, and is configured to generate the clock signal CK2 by a division by two of the clock signal CK1 (or, alternatively, by a separate division by four of the source clock signal 500). The second clock signal CK2 is provided from the PHY 540 to the MC 60' in the same manner as discussed above, by a clock interface 542 and the clock interface 62.

In further possibilities, the source clock signal 500 could be at a lower clock speed than one or both of the clock signals CK1, CK2, such that the clock generator 580 includes a speed multiplication function.

FIGS. 4 and 5 therefore provide examples of an integrated circuit device comprising: a first data processing element (for example, the PHY 440, 540) having a first data interface (such as the interface 52) configured to synchronously communicate data according to a first clock signal (such as CK1) at a first clock speed, and a second data interface (such as the interface 46) configured to synchronously communicate data at a second clock speed lower than the first clock speed; and a second data processing element (such as the MC 60') configured to operate in response to a second clock signal (such as CK2) at the second clock speed and to synchronously communicate data with the first data processing element via the second data interface according to the second clock speed; the first data processing element being configured to derive (for example by the divider 480 or the clock generator 580), from a source clock signal (such as the source clock signal 400, 500), the first clock signal and the second clock signal; and the first data processing element and the second data processing element each comprising a clock signal interface (for example the interfaces 62 and 442/542) by which the second clock signal is provided by the first data processing element to the second data processing element.

The PHY 440, 540 provides an example in which the first data processing element is a physical interface element, the first data interface being a physical interface with one or more external devices (such as the DDR memory 30), external to the integrated circuit device.

The MC 60' provides an example in which the second data processing element is a memory controller configured to communicate data with the physical interface element.

The DDR memory 30 provides an example in which the one or more external devices comprise one or more memory devices, and an example in which the one or more memory devices are double data rate (DDR) memory devices.

The examples of FIGS. 4 and 5 relate to the clock speed of the clock signal CK1 being twice that of the clock signal CK2, but as discussed above, in general, the second clock speed (of the clock signal CK2) may be a factor of n lower than the first clock speed (of the clock signal CK1), where n is greater than 1. In examples such as those shown in FIGS. 4 and 5, the first data processing element comprises a clock divider (such as the divider 480 or the clock generator 580 when acting, at least in part, as a divider) configured to divide the first clock signal CK1 by a factor of n to generate the second clock signal CK2. The factor n may be any value greater than 1, for example a rational number greater than 1, for example an integer greater than 1. For convenience of implementation of a divider (or indeed a multiplier) arrangement, the factor n may be equal to 2 raised to an integer power. In the examples discussed above, the factor n is equal to 2 (which is to say, $2^1$). Note however that the term "double" in the context of DDR memory as used in the examples is not restrictive to the use of a factor of $2^1$.

The PHY 440, 540 represents an example of a data processing element forming part of an integrated circuit device (10', 10"), the data processing element comprising a first data interface (such as the interface 52) configured to synchronously communicate data according to a first clock signal (such as CK1) at a first clock speed and a second data interface configured to synchronously communicate data with a second data processing element (such as the MC 60') at a second clock speed lower than the first clock speed; the data processing element being configured to derive, from a source clock signal, the first clock signal and a second clock signal CK2 (by the divider 480 or the clock generator 580) at the second clock speed; and a clock signal interface (such as the interface 442, 542) by which the second clock signal CK2 can be provided by the data processing element to the second data processing element.

FIGS. 6 to 10 each schematically illustrates a part of an integrated circuit device, in each case schematically illustrating at least a part of the functionality of the MC and the PHY. As discussed above, in embodiments, the MC and the PHY are fabricated as respective parts of the same integrated circuit device.

Figure 6:
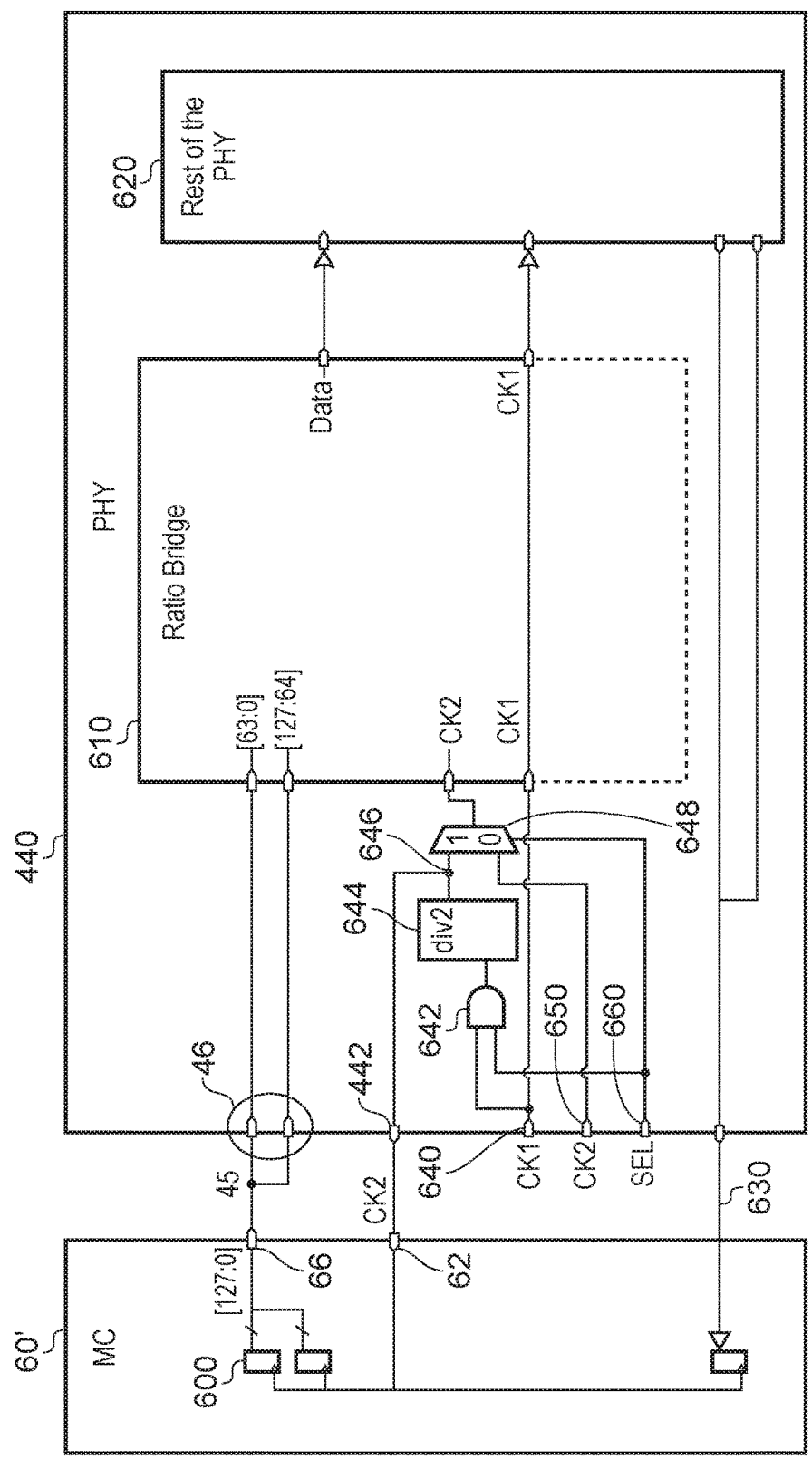
FIGS. 6 to 10 each schematically illustrates a part of an integrated circuit device.

Referring to FIG. 6, the MC 60' comprises a set 600 of data providing elements, such as (in this example) output flip-flops, each providing a respective one of a 128 bit data word for transmission from the MC 60', as the signal 45 via the interface 66 and the interface 46 to the PHY 440 or 540 (the PHY 440 being used as an example here). The data provided at the interface 66 of the MC 60' comprises successive 128 bit words (bits 0 . . . 127) at the second clock speed of CK2. At the input to the PHY 440, respective subsets (bits [63:0] and bits [127:64] in this example) are supplied to a ratio bridge 610 of the type discussed in connection with FIG. 3, for handling as smaller 64 bit words at the clock speed of CK1. After processing by the ratio bridge 610, the data and the clock CK1 are passed to the rest of the PHY (shown generically as a block 620) for subsequent processing and output.

The rest of the PHY 620 also provides a data input from an external device, providing data words which are passed as signals 630 to the MC 60' for processing.

The PHY has three other inputs, namely a CK1 input 640, a CK2 input 650 and a SEL input 660.

In operation as discussed above, the CK1 input is active and the CK2 input is inactive. The CK2 input is simply provided to allow for backwards compatibility with other circuitry which may have been designed so as to supply the CK2 signal to the PHY. In operation according to the principles being discussed here, the CK2 input 650 is not used and the signal at the SEL input is high.

The signal at the CK1 input is combined by an AND gate 642 with the signal at the SEL input. This has the effect of passing the CK1 signal to a divider 644 if the SEL signal is high, and not passing the CK1 signal if the SEL signal is low. So, in normal operation (in which the PHY provides the CK2 clock signal to the MC 60') the SEL signal is high.

The divider 644 (as an example of the divider 480 discussed above) divides its input by two. Its output signal 646 provides the CK2 signal at the clock signal interface 442, to be provided to the MC 60'. The output of the divider 644 is also provided to a multiplexer 648.

The multiplexer 648 is controlled by the SEL signal. When the SEL signal is high, the multiplexer 648 passes the output of the divider 644 as the CK2 signal used by parts of the PHY. When the SEL signal is low, the multiplexer 648 passes the signal at the CK2 input 650 as the CK" signal for use by the PHY 440.

So, in normal operation, the SEL signal is high, the divider 644 receives and divides the input CK1 signal and provides it to the MC 60' as well as (via the multiplexer 648) to parts of the PHY which require it.

In legacy operation, the SEL signal is set low, which not only means that the multiplexer 648 passes the CK2 signal at the input 650, it also means that the divider 644 does not operate, or in other words is selectively disabled, so as to save power and heat generation which would be used in generating a clock signal which is not used. This provides an example of the first data processing element comprising control logic (such as the AND gate 642) configured to selectively disable operation of the clock divider.

In some example arrangements, multiple PHYs are associated with a single MC. FIGS. 7 to 10 provide examples of such arrangements in which the integrated circuit device comprises two or more first data processing elements each generating a respective second clock signal. In FIGS. 7 to 10, operations of the PHY which were already described with reference to FIGS. 1 to 6 will not be described again. In fact, in each of FIGS. 7 to 10, an example is provided of two PHYs (though other numbers of PHYs greater than two could be used) referred to as PHY0 and PHY1, in which none of the internal operation of the PHYs is illustrated. The PHYs in FIGS. 7 to 10 are shown as having four interfaces with the respective MCs: a data input interface 46; A CK1 input 640, a data output interface 700 (to provide the signal 630 of FIG. 6 to the MC) and a CK2 output interface 442 (to provide the CK2 clock generated by a PHY to the MC). Each PHY generates its own version of the clock signal CK2, so in FIGS. 7 to 10 these are labelled as CK2 out (0) (in the case of PHY0) and CK2 out (1) (in the case of PHY 1).

Figure 7:
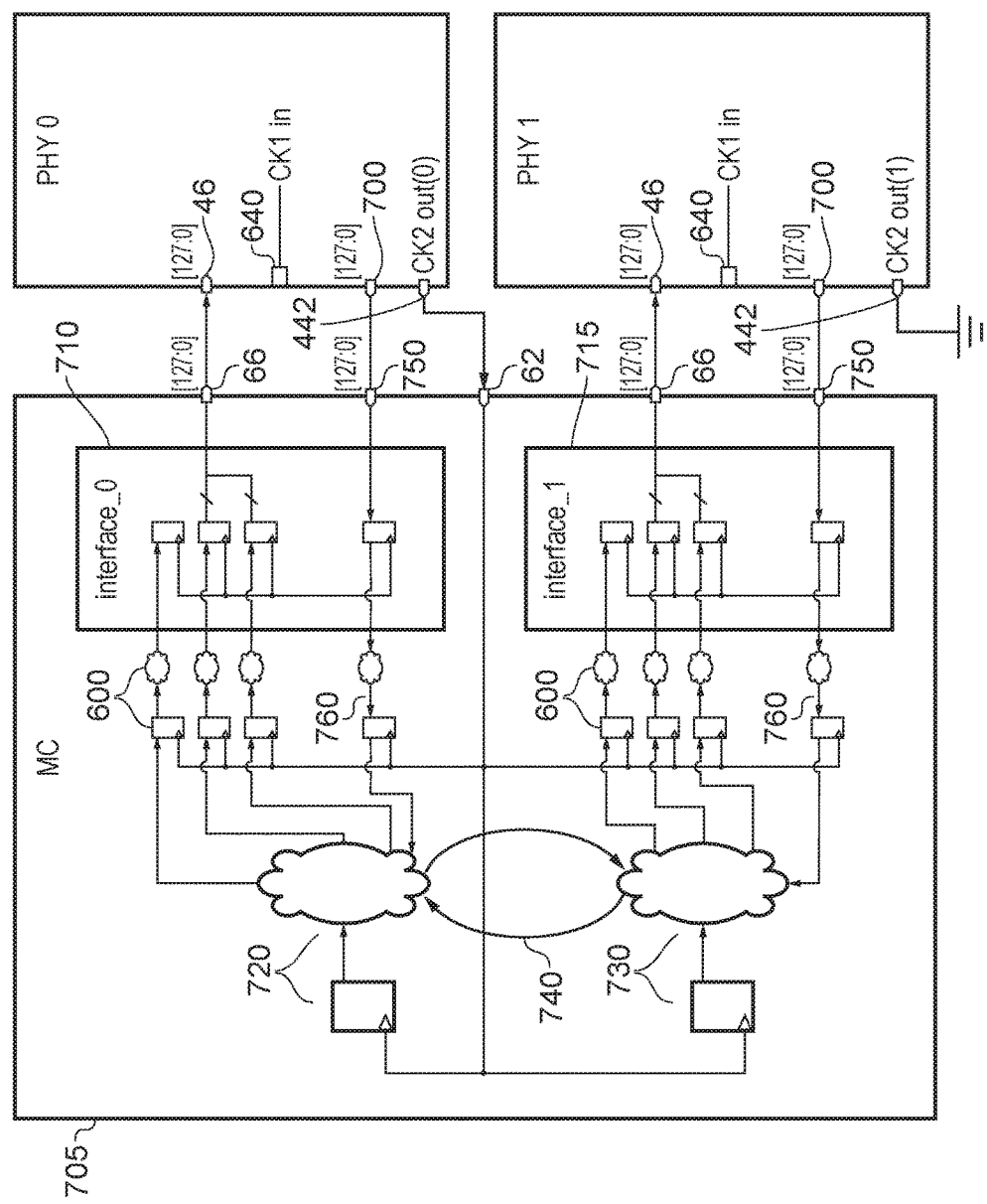

Turning to the MC and referring first to FIG. 7, the MC 705 comprises an interface block 710, 715 for each PHY (labelled as interface_0 and interface_1), each connected to respective data interfaces 66, 750 for data input and output respectively. The interface blocks 710, 715 schematically provide the functionality of the elements 600 of FIG. 6, in the context of data output (to the respective PHY) and data input from the respective PHY. Further data handling elements 600, 760 provide communication between the interface blocks and control logic sections 720, 730 for each respective PHY. The control logic sections control data communications by the MC with the PHY(s). The respective control logic sections and data communications 740 between the two control logic sections are shown in schematic form, partly because the precise nature of such logic and communications is not important to the underlying principles which will be discussed as to which clock signal controls these operations.

The MC 705 of FIG. 7 comprises a single CK2 input interface 62 arranged to receive a CK2 clock signal from one of the PHYs (such as PHY0 in this example). The CK2 signal generated by the other PHY (such as PHY1 in this example) is not used (and is schematically illustrated as being grounded or connected to a fixed voltage rail). the CK2 signal received by the single CK2 input interface is used to control operations of the whole of the MC 705 of FIG. 7.

FIGS. 7 to 10 therefore provide an example of the second data processing element comprising: two or more interfaces (such as the respective interfaces 66) for data communication with respective first data processing elements (such as PHY0, PHY1).

The arrangement of FIG. 7 means that the clock signal CK2, by which the whole MC 705 is controlled, is well aligned in time with operations of the PHY which generates that clock signal (PHY0 in this example) but is not necessarily well aligned with operations of the other PHY (PHY1 in this example), for the reasons discussed earlier in connection with FIG. 1. This can lead to a disparity in performance between the two PHYs, despite their operating with the same MC.

Arrangements which address this potential issue will now be described with reference to FIGS. 8 to 10. Parts which have already been described with reference to FIG. 7 will not be described in detail again.

Figure 8:
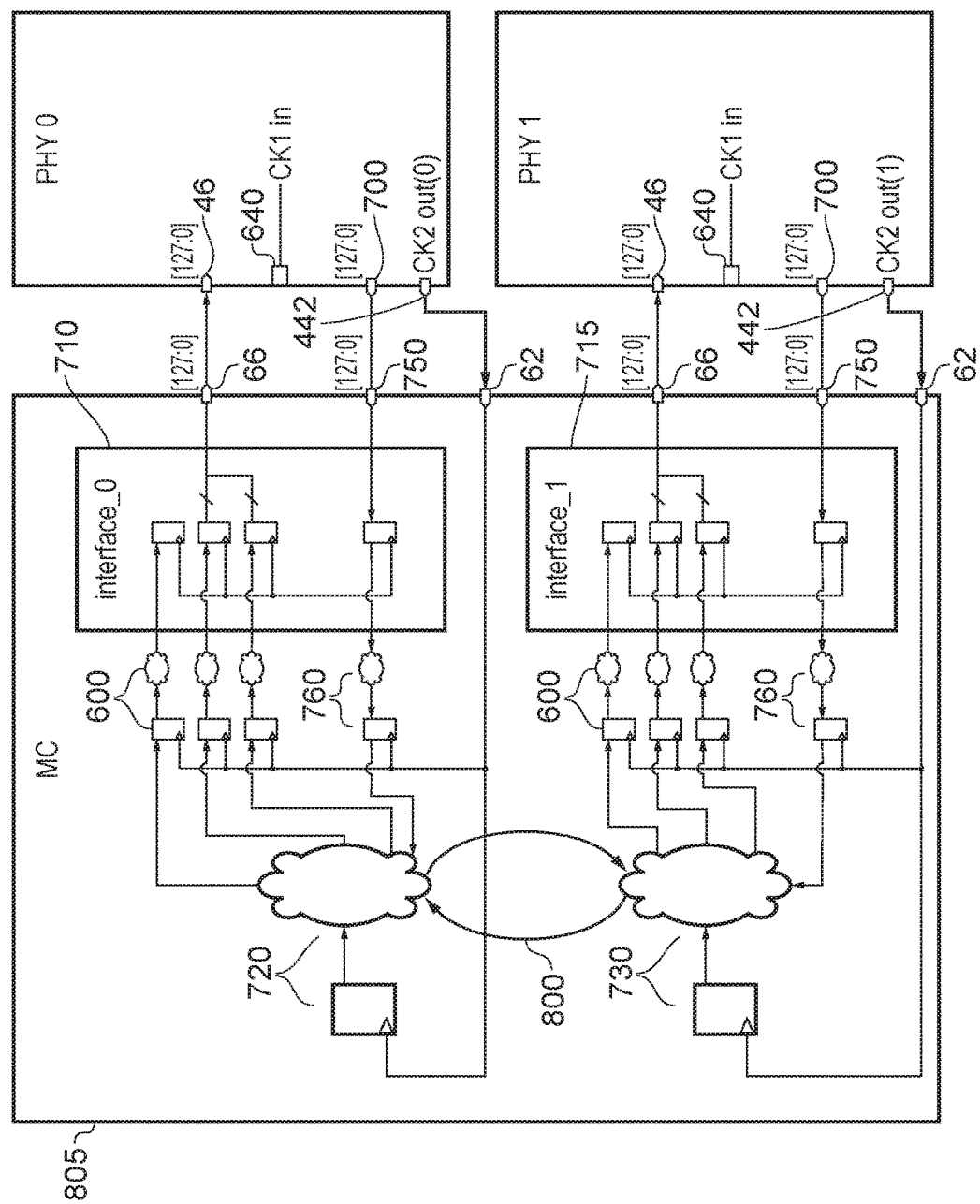

In FIG. 8, the MC 805 has two CK2 input interfaces 62. The respective parts 710, 715, 600, 760, 720/730 of the MC which operate in connection with a particular PHY (PHY0 or PHY1) are arranged so as to operate under the control of a respective CK2 signal generated by and provided by that PHY. So, those parts (including the interface block 710 and the control logic section 720) of the MC 805 which operate in connection with data communication with PHY0 operate under the control of the CK2 signal supplied as CK2 out (0). Those parts of the MC 805 (including the interface block 715 and the control logic section 730) which operate in connection with data communication with PHY1 operate under the control of the CK2 signal supplied as CK2 out (1). This provides an example of the MC having two or more clock signal interfaces each configured to receive a second clock signal from a respective first data processing element, for use in data communication with that respective first data processing element.

As regards the control logic sections 720, 730, these (collectively) provide an example of the second data processing element comprising control circuitry configured to control data communication with multiple ones of the first data processing elements. Taken individually, in the context of FIG. 8, they provide examples of multiple control circuitry sections, each associated with communication with a respective first data processing element.

In FIG. 8, data communications 800 between the control logic sections is performed asynchronously with respect to either of the clock signals CK2. This provides an example of the multiple control circuitry sections being configured to communicate with one another asynchronously with respect to the second clock signals.

Figure 9:
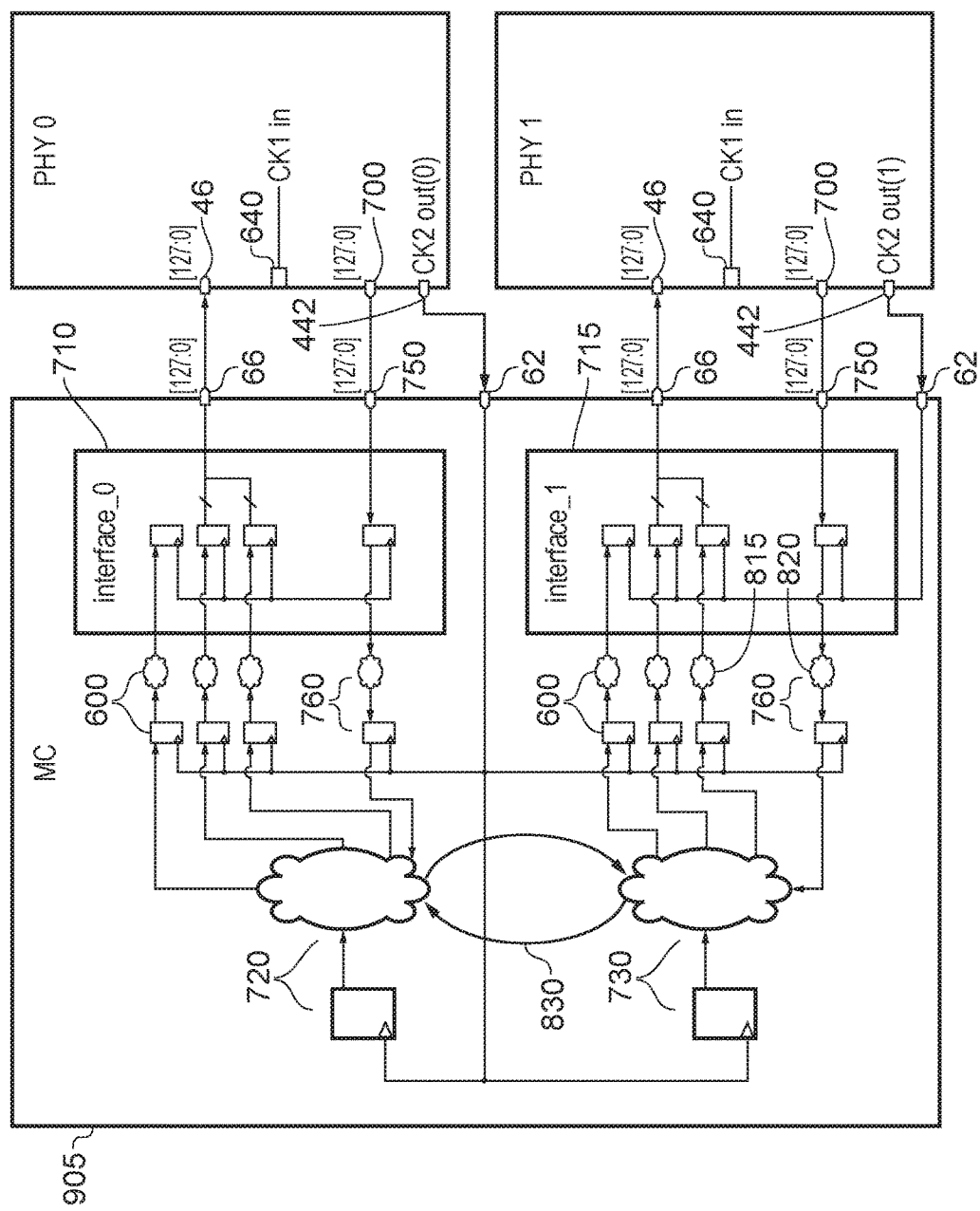

In FIG. 9, the control logic sections 720, 730 take part in synchronous data communications 830 with one another. They both operate under the control of a single version of the CK2 clock signal (in the example of FIG. 9, the version of the CK2 signal generated by PHY0). This provides an example of the control circuitry being configured to operate under the control of one of the second clock signals.

However, in FIG. 9, the interface blocks 710, 715 in respect of data communication with one of the PHYs (such as PHY0) operate under the control of the CK2 signal generated by and provided by that PHY. Also, at least a part of the elements 600, 760 in respect of data communication with the other (or another) one of the PHYs (such as PHY1) operate under the control of the CK2 signal generated by that PHY. In this particular example, a final stage 815 of the elements 810 (relating to data communication to PHY1) and a first stage 825 of the elements 820 (relating to data communication from PHY1) operate under the control of the clock signal CK2 generated by and provided by PHY1.

This means that in the two-PHY example of FIG. 9, for one of the PHYs (such as PHY0), the interface 710 and the control logic 720 all operate under the control of the CK2 signal generated by and provided by that PHY. For the other one of the PHYs (such as PHY1) the interface 715 and the control logic 730 operate under different respective versions of the CK2 signal. At least a part 715 of the MC 905, being a part of the MC 905 which may be considered to have a greater need of precise time-alignment with operations of the respective PHY, operate under the control of the CK2 signal generated by and provided by that respective PHY (PHY1). The control logic associated with communications to and from PHY1, having a less critical requirement for time alignment, operates under the control of the CK2 signal generated by and provided by a different PHY, namely PHY0. Note that the two versions of the CK2 signal are both generated from the same original CK1 signal by the same division process and so have the same frequency; it is just their phase, for example the relative timing of their clock edges, which can differ in this context.

Figure 10:
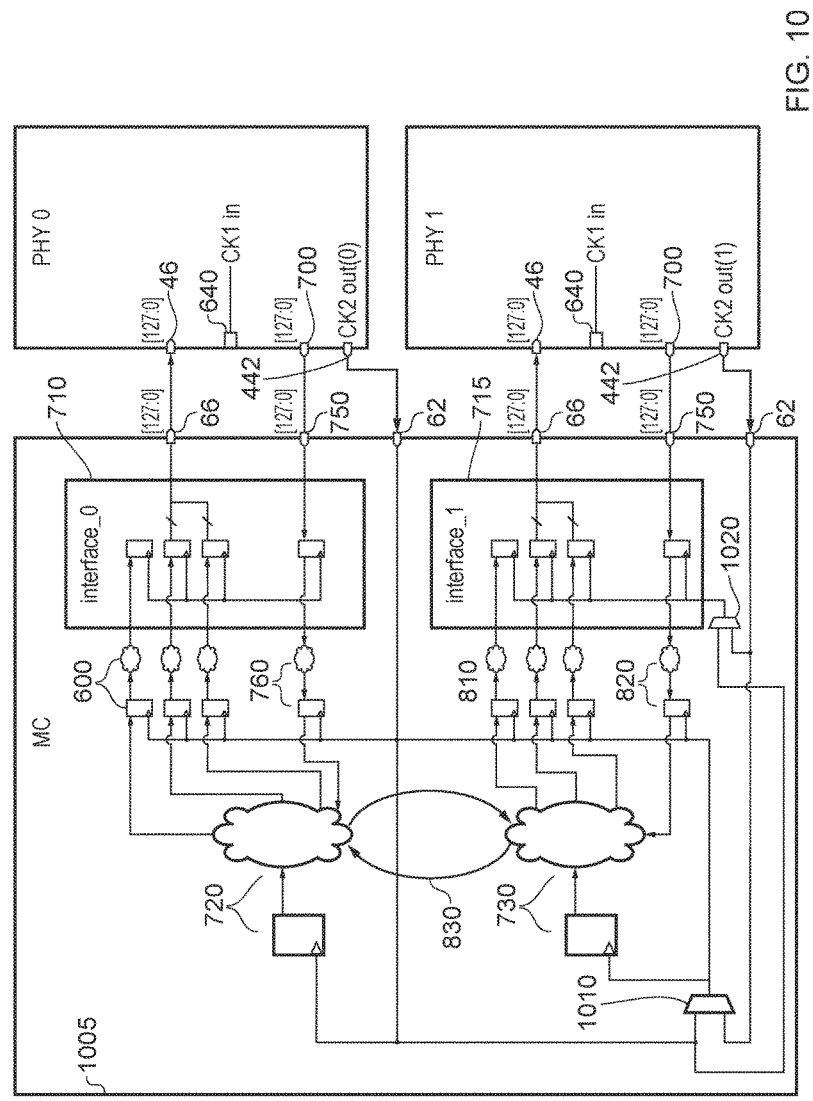

An MC 1005 in FIG. 10 is similar to that shown in FIG. 9, in that the control logic sections 720, 730 communicate synchronously and operate under the control of a common version of the clock signal CK2 (that generated by PHY0 in this example), but the version of the clock signal CK2 which is used to control operations of the elements 810, 820 and the interface 715 (relating to communication with PHY1) is selectable between the signal CK2 generated by PHY0 and the signal CK2 generated by PHY 1, under the control of multiplexers 1010, 1020 controlled by a control signal (not shown) which can be externally supplied or set as part of the fabrication process.

Figure 11:
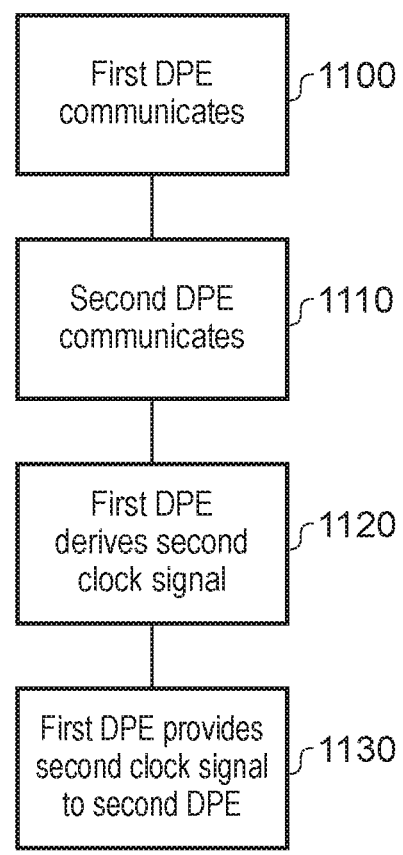
FIG. 11 is a schematic flowchart representing a method of operation of an integrated circuit device.

FIG. 11 is a schematic flowchart representing a method of operation of an integrated circuit device. Note that the order of steps in FIG. 11 does not necessarily indicate a serial order of execution; indeed, the data and clock communication between the first and second data processing elements (DPEs as represented in FIG. 11) may be taking place on an ongoing basis such that all four steps are executed simultaneously. The ordering of steps in FIG. 11 is therefore (in at least some examples) simply for convenience of explanation.

At a step 1100, a first data processing element synchronously communicates data via a first interface at a first clock speed and synchronously communicating data via a second data interface at a second clock speed lower than the first clock speed.

At a step 1110, a second data processing element, in response to a second clock signal at the second clock speed, synchronously communicates data with the first data processing element via the second data interface at the second clock speed.

At a step 1120, the first data processing element derives, from a source clock signal, the first clock signal and the second clock signal.

At a step 1130, the first data processing element provides the second clock signal to the second data processing element.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

I claim:

1. An integrated circuit device comprising:
   a physical interface element having a first data interface configured to synchronously communicate data signals according to a first clock signal at a first clock speed, said first data interface being a physical interface with one or more external devices, external to said integrated circuit device, and a second data interface configured to synchronously communicate said data signals, communicated by said one or more external devices according to said first clock signal at said first clock speed, at a second clock speed lower than said first clock speed; and
   a data processing element, different than the one or more external devices, configured to operate in response to a second clock signal at said second clock speed and to synchronously communicate said data signals with said physical interface element via said second data interface according to said second clock speed;
   said physical interface element being configured to derive, from a source clock signal, said first clock signal and said second clock signal; and
   said physical interface element and said data processing element each comprising a clock signal interface by which said second clock signal is provided by said physical interface element to said data processing element.

2. An integrated circuit device according to claim 1, in which said data processing element is a memory controller configured to communicate data signals with said physical interface element.

3. An integrated circuit device according to claim 2, in which said one or more external devices comprise one or more memory devices.

4. An integrated circuit device according to claim 3, in which said one or more memory devices are double data rate (DDR) memory devices.

5. An integrated circuit device according to claim 1, in which:
   said second clock speed is a factor of n lower than said first clock speed, where n is greater than 1; and
   said physical interface element comprises a clock divider configured to divide said first clock signal by a factor of n to generate said second clock signal.

6. An integrated circuit device according to claim 5, in which n is equal to 2raised to an integer power.

7. An integrated circuit device according to claim 5, in which said physical interface element comprises control logic configured to selectively disable operation of said clock divider.

8. An integrated circuit device according to claim 1, in which said source clock signal is at the same clock speed as said first clock signal.

9. An integrated circuit device according claim 1, in which said integrated circuit device comprises two or more physical interface elements each generating a respective second clock signal.

10. An integrated circuit device according to claim 9, in which said data processing element comprises:
    two or more interfaces for data communication with respective physical interface elements; and
    two or more clock signal interfaces each configured to receive a second clock signal from a respective physical interface element, for use in data communication with that respective physical interface element.

11. An integrated circuit device according to claim 10, in which said data processing element comprises control circuitry configured to control data communication with multiple ones of said physical interface elements.

12. An integrated circuit device according to claim 11, in which said control circuitry is configured to operate under the control of one of said second clock signals.

13. An integrated circuit device according to claim 11, in which said control circuitry comprises multiple control circuitry sections, each associated with communication with a respective physical interface element, said multiple control circuitry sections being configured to communicate with one another asynchronously with respect to said second clock signals.

14. A physical interface element forming part of an integrated circuit device, said physical interface element comprising:
   a first data interface configured to synchronously communicate data signals according to a first clock signal at a first clock speed and a second data interface configured to synchronously communicate said data signals, communicated by said first data interface according to said first clock signal at said first clock speed, with a data processing element that is part of said integrated circuit device at a second clock speed lower than said first clock speed;
   said physical interface element being configured to derive, from a source clock signal, said first clock signal and a second clock signal at said second clock speed; and
   a clock signal interface by which said second clock signal can be provided by said physical interface element to said data processing element.

15. An integrated circuit device comprising:
   a physical interface means for synchronously communicating data signals via a first data interface, according to a first clock signal at a first clock speed, said first data interface being a physical interface with one or more external devices, external to said integrated circuit device, and for synchronously communicating said data signals, communicated by said one or more external devices according to said first clock signal at said first clock speed via a second data interface at a second clock speed lower than said first clock speed; and
   a data processing means, different than the one or more external devices, responsive to a second clock signal at said second clock speed, for synchronously communicating said data signals with said physical interface means via said second data interface at said second clock speed;
   said physical interface means comprising means for deriving, from a source clock signal, said first clock signal and said second clock signal; and
   said physical interface means and said data processing means each comprising a clock signal interface means by which said second clock signal is provided by said physical interface means to said data processing means.

16. A physical interface element forming part of an integrated circuit device, said physical interface element comprising:
   a first data interface means for synchronously communicating data signals according to a first clock signal at a first clock speed, and a second data interface means for synchronously communicating said data signals, communicated by said first data interface means according to said first clock signal at said first clock speed, with a data processing element that is part of said integrated circuit device at a second clock speed lower than said first clock speed;
   said physical interface element comprising means for deriving, from a source clock signal, said first clock signal and a second clock signal at said second clock speed; and
   said physical interface element comprising means for providing said second clock signal to said data processing element.

17. A method of operation of an integrated circuit device, said method comprising:
   a physical interface element synchronously communicating data signals via a first interface according to a first clock signal at a first clock speed, said first data interface being a physical interface with one or more external devices, external to said integrated circuit device, and synchronously communicating said data signals, communicated by said one or more external devices according to said first clock signal at said first clock speed, via a second data interface at a second clock speed lower than said first clock speed;
   a data processing element, different than the one or more external devices, in response to a second clock signal at said second clock speed, synchronously communicating said data signals with said physical interface element via said second data interface at said second clock speed;
   said physical interface element deriving, from a source clock signal, said first clock signal and said second clock signal; and
   said physical interface element providing said second clock signal to said data processing element.

* * * * *